(12) United States Patent
Hsieh

(10) Patent No.: US 12,363,851 B2
(45) Date of Patent: Jul. 15, 2025

(54) FRAME MODULE AND SERVER INCLUDING THE SAME

(71) Applicants: INVENTEC (PUDONG) TECHNOLOGY CORPORATION, Shanghai (CN); INVENTEC CORPORATION, Taipei (TW)

(72) Inventor: Han-Chih Hsieh, Taipei (TW)

(73) Assignees: INVENTEC (PUDONG) TECHNOLOGY CORPORATION, Shanghai (CN); INVENTEC CORPORATION, Taipei (TW)

( * ) Notice: Subject to any disclaimer, the term of this patent is extended or adjusted under 35 U.S.C. 154(b) by 225 days.

(21) Appl. No.: 18/209,346

(22) Filed: Jun. 13, 2023

(65) Prior Publication Data

US 2024/0314967 A1 Sep. 19, 2024

(30) Foreign Application Priority Data

Mar. 14, 2023 (CN) .......................... 202310246314.9

(51) Int. Cl.
*H05K 7/14* (2006.01)
*G06F 1/16* (2006.01)
*G06F 1/18* (2006.01)

(52) U.S. Cl.
CPC ........... *H05K 7/1489* (2013.01); *G06F 1/181* (2013.01); *G06F 1/185* (2013.01); *H05K 7/1487* (2013.01)

(58) Field of Classification Search
CPC .. H05K 7/1402; H05K 7/1404; H05K 7/1405; H05K 7/1408; H05K 7/1424; H05K 7/1425; H05K 7/1431; H05K 7/1485; H05K 7/1487; H05K 7/1488; H05K 7/1489; H05K 5/0217; H05K 5/30; H05K 5/0286; H05K 5/0291; H05K 5/0221; G06F 1/16; G06F 1/181; G06F 1/183; G06F 1/185; G06F 1/186; G06F 1/187; G06F 15/16;
(Continued)

(56) References Cited

U.S. PATENT DOCUMENTS 6,375,486 B1 * 4/2002 Yu .......................... H01R 13/639
439/59
6,884,100 B1 * 4/2005 Hsiao ..................... H01R 12/721
439/327

(Continued)

*Primary Examiner* — Allen L Parker
*Assistant Examiner* — Gage Crum
(74) *Attorney, Agent, or Firm* — Maschoff Brennan

(57) ABSTRACT

A frame module is configured to be detachably disposed on a casing of a server and configured to secure an expansion card. One side of the expansion card includes an electrical connector portion and an engagement recessed portion arranged adjacent to each other. The frame module includes a main frame, a riser card and a fastening assembly. The main frame includes a first plate and a second plate connected to each other. The riser card is disposed on the first plate and includes a connection slot configured for the electrical connector portion to be inserted to. The fastening assembly is slidably disposed on the first plate and includes a block portion. When the fastening assembly is in a fastening position, the block portion presses against the engagement recessed portion. When the fastening assembly is in a releasing position, the block portion is removed from the engagement recessed portion.

9 Claims, 10 Drawing Sheets

(58) Field of Classification Search
CPC .............. G06F 15/161; H01R 12/7029; H01R 12/7023; H01R 12/7058; H01R 12/721; H01R 12/737; H01R 13/6275; H01R 13/639; H01R 4/50; H01R 43/26; H01R 13/629

See application file for complete search history.

(56) References Cited

U.S. PATENT DOCUMENTS

| | | | | |
|---|---|---|---|---|
| 6,902,419 B2* | 6/2005 | Conway | ............ | H01R 12/7005 |
| | | | | 439/347 |
| 7,525,815 B2* | 4/2009 | Chen | ............ | G06F 1/185 |
| | | | | 361/755 |
| 8,514,585 B2* | 8/2013 | Zhang | ............ | H05K 5/0269 |
| | | | | 361/801 |
| 8,737,054 B2* | 5/2014 | Zhou | ............ | G06F 1/185 |
| | | | | 361/801 |
| 11,106,252 B2* | 8/2021 | Chung | ............ | F16B 35/06 |
| 11,507,149 B2* | 11/2022 | Petersen, II | ............ | G06F 1/185 |
| 12,238,886 B2* | 2/2025 | Tsorng | ............ | H05K 7/1487 |
| 2012/0281373 A1* | 11/2012 | Bohannon | ............ | H05K 7/1489 |
| | | | | 361/756 |
| 2013/0148286 A1* | 6/2013 | Liu | ............ | G06F 1/185 |
| | | | | 248/225.21 |
| 2014/0168910 A1* | 6/2014 | Yin | ............ | G06F 1/186 |
| | | | | 361/747 |
| 2017/0115704 A1* | 4/2017 | Ent | ............ | G06F 1/186 |
| 2021/0034097 A1* | 2/2021 | Jangili Ganga | ............ | G06F 13/4282 |
| 2023/0301012 A1* | 9/2023 | Lin | ............ | H05K 7/1487 |
| | | | | 361/679.02 |
| 2023/0324963 A1* | 10/2023 | Wu | ............ | G06F 1/185 |
| 2023/0344159 A1* | 10/2023 | Hsu | ............ | H01R 12/737 |

* cited by examiner

FRAME MODULE AND SERVER INCLUDING THE SAME

CROSS-REFERENCE TO RELATED APPLICATIONS

This non-provisional application claims priority under 35 U.S.C. § 119(a) on Patent Application No(s). 202310246314.9 filed in China on Mar. 14, 2023, the entire contents of which are hereby incorporated by reference.

TECHNICAL FIELD

This disclosure relates to a frame module and a server including the same, more particularly to a frame module capable of securing expansion cards of different lengths and a server including the same.

BACKGROUND

With the coming of the internet era, a variety of technology and device developments related to the internet are growing flourishly. Moreover, the structure improvement of server chassis is currently a highly valued development project.

In general, manufacturers will further equip servers with expansion function modules to meet customers' needs for multi-functional and high-performance servers. These expansion function modules are designed for customers to install the necessary expansion cards. Conventionally, it is necessary to install metal extension components on the expansion function module frame to fix the edge of the expansion card. However, the metal extension components can only fix expansion cards of specific lengths, and when the expansion function module is installed with full-height or long card type expansion cards, the expansion cards are more prone to detach from the slot due to dropping or vibration tests. In addition, since the metal extension components are installed on the outwardly extending direction of the connector cable in the expansion function module frame, the screws used to secure the metal extension components may also block the installation of relevant connector cables.

In addition, conventional expansion function module frames are fixed to the motherboards with floating screws. However, because there is no guiding device between the expansion function module frame and the motherboard, the assembly personnel need to accurately align them before installing the expansion function module inside the server chassis. Moreover, fixing the expansion function module frame with floating screws requires additional screw holes to be opened on the motherboard, which increases the limitations of the wiring design on the motherboard. In addition, when the user wants to remove the expansion function module frame from the motherboard, if the user forgets to remove the floating screws in advance and directly pulls the expansion function module, it is easy to cause damage to the expansion function module.

Therefore, how to effectively secure expansion cards of different lengths, avoid screws for fixing metal extension components from blocking the installation of related connector cables, and avoid the aforementioned problems arising from fixing the expansion function module frame with floating screws will be the goal that developers strive to achieve.

SUMMARY

The disclosure is to provide a frame module and a server including the same capable of securing expansion cards of different lengths.

One embodiment of the disclosure provides a frame module configured to be detachably disposed on a casing of a server and configured to secure at least one expansion card. One side of the at least one expansion card includes an electrical connector portion and an engagement recessed portion that are arranged adjacent to each other. The frame module includes a main frame, a riser card and a fastening assembly. The main frame includes a first plate and a second plate that are connected to each other. The riser card is disposed on the first plate, and the riser card includes at least one connection slot configured for the electrical connector portion of the at least one expansion card to be inserted to. The fastening assembly is slidably disposed on the first plate, and the fastening assembly includes at least one block portion. The fastening assembly includes a fastening position and a releasing position. In addition, when the fastening assembly is located in the fastening position, the at least one block portion is configured to press against the engagement recessed portion of the at least one expansion card, so that the at least one expansion card is located between and clamped by the second plate and the fastening assembly. When the fastening assembly is located in the releasing position, the at least one block portion is configured to be removed from the engagement recessed portion of the at least one expansion card, so that the at least one expansion card is movable with respect to the at least one connection slot.

One embodiment of the disclosure provides a server including a casing, a frame module and at least one expansion card. The frame module is detachably disposed on the casing, and the frame module includes a main frame, a riser card and a fastening assembly. The main frame includes a first plate and a second plate that are connected to each other. The riser card is dispose on the first plate, and the riser card includes at least one connection slot. The fastening assembly is slidably disposed on the first plate, and the fastening assembly includes at least one block portion. The fastening assembly includes a fastening position and a releasing position. One side of the at least one expansion card includes an electrical connector portion and an engagement recessed portion that are arranged adjacent to each other, and the electrical connector portion is inserted to the at least one connection slot. In addition, when the fastening assembly is located in the fastening position, the at least one block portion presses against the engagement recessed portion of the at least one expansion card, so that the at least one expansion card is located between and clamped by the second plate and the fastening assembly. When the fastening assembly is located in the releasing position, the at least one block portion is removed from the engagement recessed portion of the at least one expansion card, so that the at least one expansion card is movable with respect to the at least one connection slot.

In view of the above description, the expansion card includes the engagement recessed portion arranged adjacent to the electrical connector portion, and the position of the engagement recessed portion relative to the electrical connector portion is fixed in design and does not change with different expansion card specifications. Accordingly, the fastening assembly slidable relative to the main frame is provided in the frame module as a fixing means for fixing the expansion card in place, and the block portion of the fastening assembly is configured to press against the engagement recessed portion of the expansion card. Therefore, the requirement of securing expansion cards of different lengths in the frame module is met.

BRIEF DESCRIPTION OF THE DRAWINGS

The disclosure will become more fully understood from the detailed description given hereinbelow and the accompanying drawings which are given by way of illustration only and thus are not limitative of the disclosure and wherein.

DETAILED DESCRIPTION

Aspects and advantages of the invention will become apparent from the following detailed descriptions with the accompanying drawings. For purposes of explanation, one or more specific embodiments are given to provide a thorough understanding of the invention, and which are described in sufficient detail to enable one skilled in the art to practice the described embodiments. It should be understood that the following descriptions are not intended to limit the embodiments to one specific embodiment. On the contrary, it is intended to cover alternatives, modifications, and equivalents as can be included within the spirit and scope of the described embodiments as defined by the appended claims.

Figure 1:
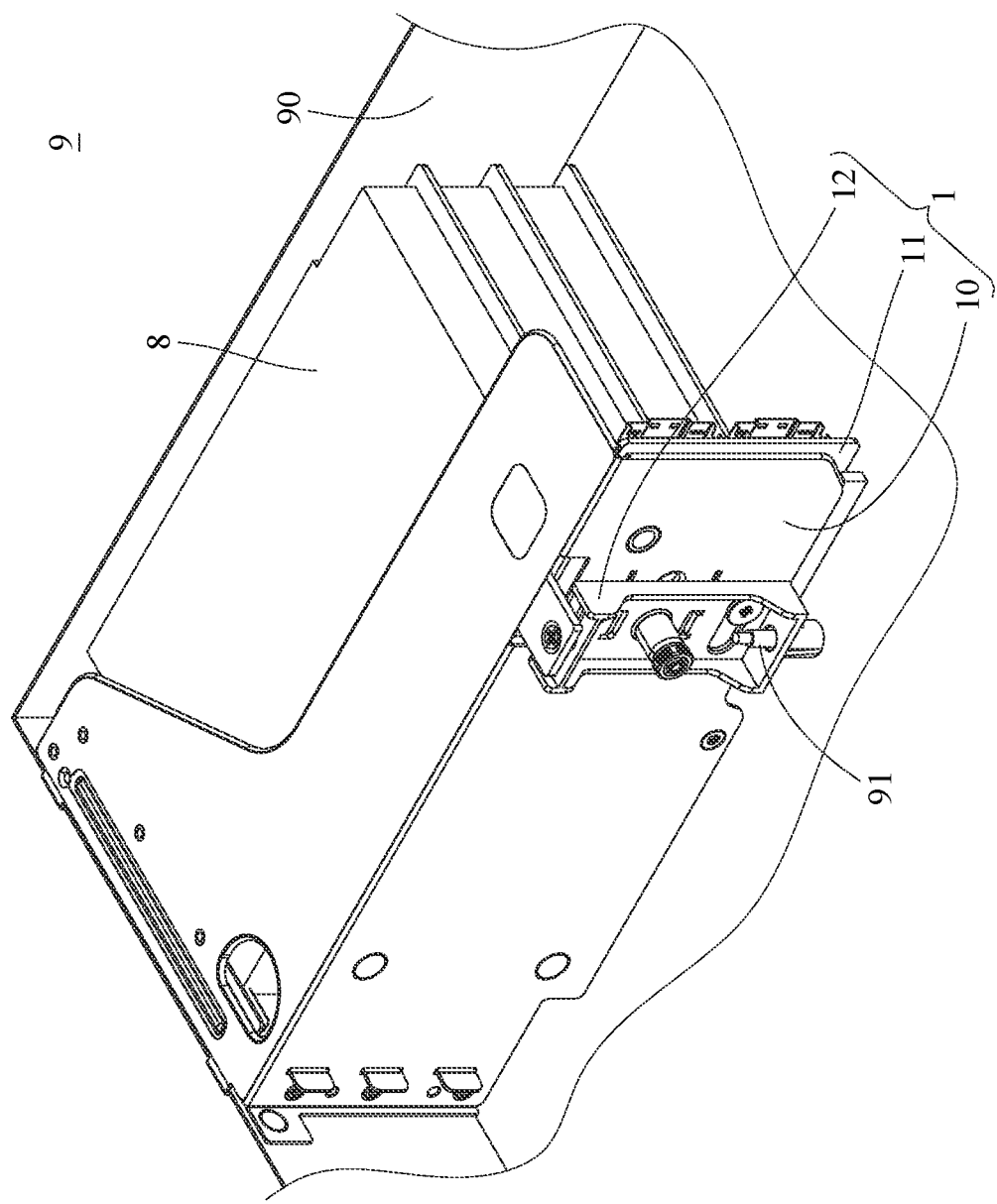
FIG. 1 is a partial perspective view of a server in accordance with one embodiment of the disclosure.
Figure 2:
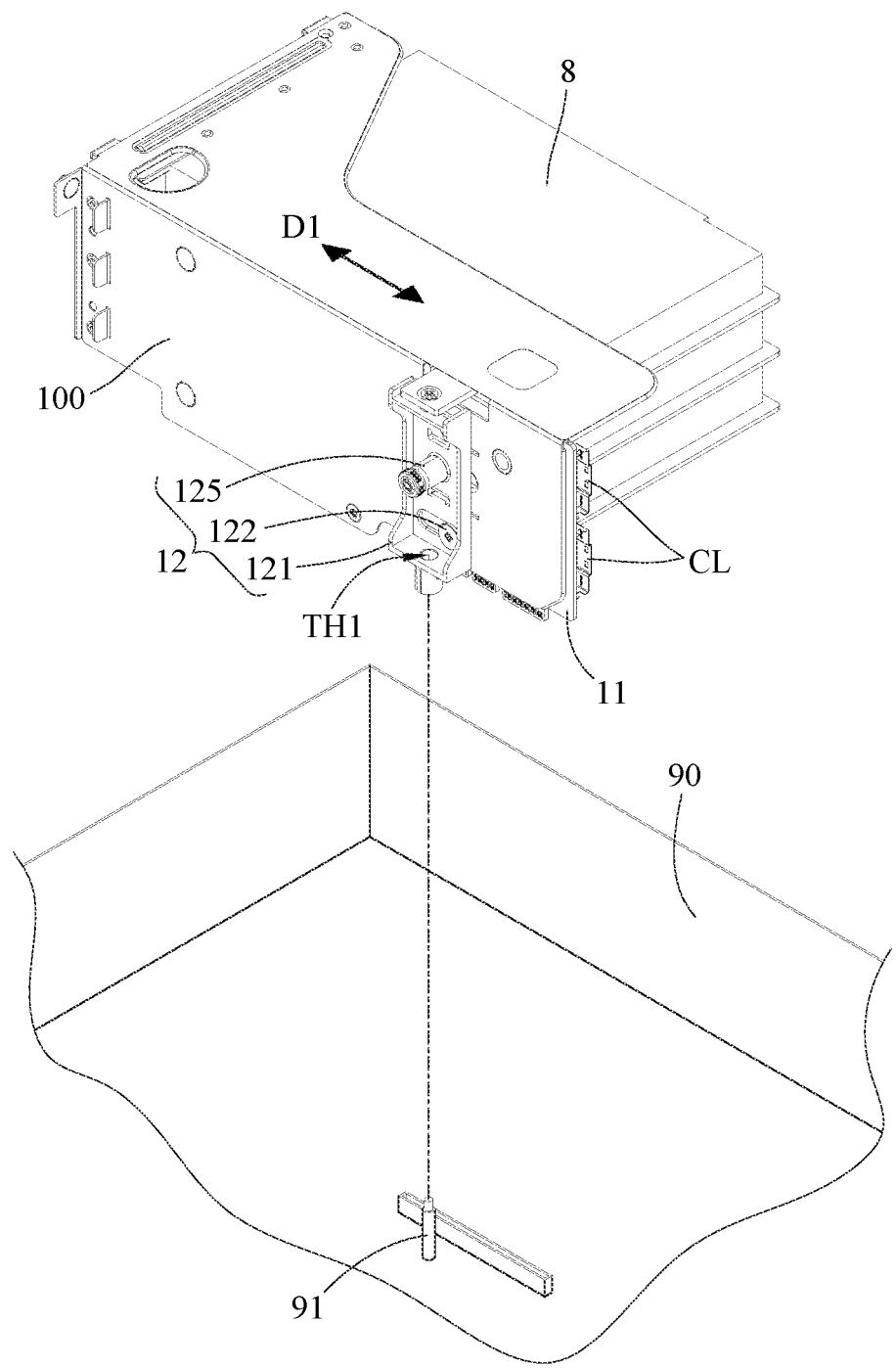
FIG. 2 is a schematic view of a frame module and an expansion card separated from a casing of the server in FIG. 1.
Figure 3:
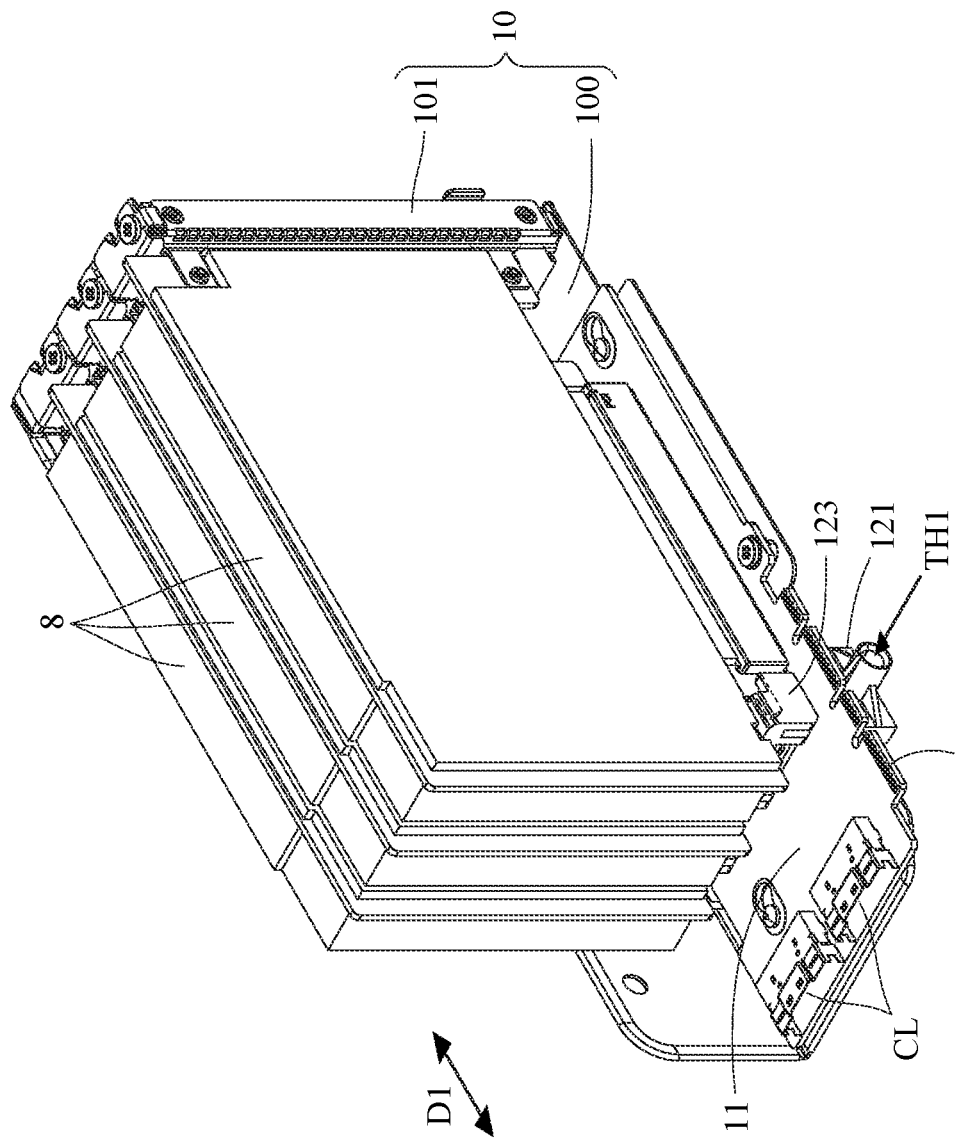
FIG. 3 is a perspective view of the frame module and the expansion card in FIG. 1.
Figure 4:
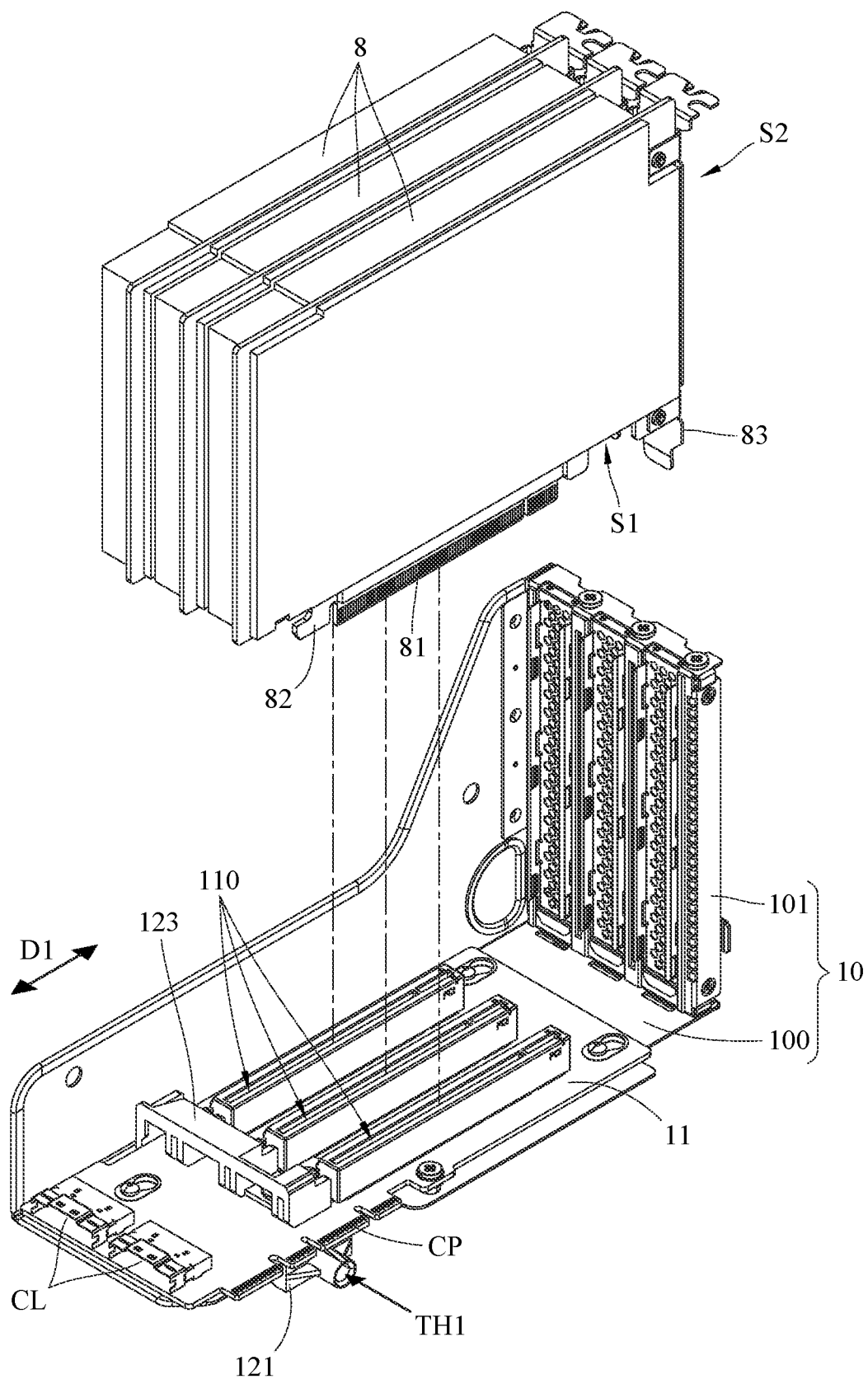
FIG. 4 is a schematic view of the expansion card separated from the frame module in FIG. 3.

Please refer to FIG. 1 to FIG. 4. FIG. 1 is a partial perspective view of a server in accordance with one embodiment of the disclosure, FIG. 2 is a schematic view of a frame module and an expansion card separated from a casing of the server in FIG. 1, FIG. 3 is a perspective view of the frame module and the expansion card in FIG. 1, and FIG. 4 is a schematic view of the expansion card separated from the frame module in FIG. 3.

A server 9 includes a casing 90, three expansion cards 8 and a frame module 1. In this embodiment, the server 9 is a 2U server as an example, but the disclosure is not limited thereto. In other embodiments, the server may be, for example, a 1U server or a 4U server, and the server may be provided with varying numbers of expansion cards. In this embodiment, the expansion cards 8 are exemplarily PCIe-based, but the disclosure is not limited thereto. Moreover, the expansion cards 8 are, for example, graphics processing units (GPU), but the disclosure is not limited thereto. In other embodiments, the expansion cards 8 may be, for example, sound cards, network interface cards or memory cards providing various functions.

As shown in FIG. 4, each of the expansion cards 8 includes a first side S1 and a second side S2, and the first side S1 is adjacent and connected to the second side S2. The first side S1 of each of the expansion cards 8 includes an electrical connector portion 81 and an engagement recessed portion 82 that are arranged adjacent to each other, and the second side S2 of each of the expansion cards 8 includes a metal mounting bracket 83. The electrical connector portion 81, for example, includes gold fingers configured to be inserted into a PCIe connection slot. In general, a PCIe interface card may be a full-length PCIe interface card, a ¾-length PCIe interface card, a half-length PCIe interface card, or a full-height PCIe interface card. A PCIe-based card (e.g., PCIe Gen 3.0 or newer PCIe standards) includes a retention notch/tab structure (corresponding to the engagement recessed portion 82 of the expansion card 8 in this embodiment) adjacent to the gold fingers, and the position of the retention notch/tab structure relative to the gold fingers is fixed in design and does not change with different PCIe-based card specifications (e.g., different dimensions). Therefore, in this disclosure, the retention notch/tab structure is used as part of a fixture means for securing PCIe-based cards having different specifications.

The frame module 1 is detachably disposed on the casing 90, and the frame module 1 includes a main frame 10, a riser card 11 and a fastening assembly 12.

The main frame 10 includes a first plate 100 and a second plate 101 that are connected to each other. The first plate 100 includes a first positioning hole H1, a second positioning hole H2 and two guiding through holes 1001.

The riser card 11 is disposed on the first plate 100 of the main frame 10, and the riser card 11 includes an electrical connector portion CP, two connection cables CL and three connection slots 110. The electrical connector portion CP is, for example, inserted to a connection slot (not shown in figures) of a motherboard (not shown in figures) of the server 9, and the connection cables CL extend in a direction away from the second plate 101 of the main frame 10 to be electrically connected to other components. The electrical connector portions 81 of the expansion cards 8 are inserted to the connection slots 110 of the riser card 11, respectively, and the metal mounting brackets 83 of the expansion cards 8 are fixed to the second plate 101 of the main frame 10, for example, via fasteners, such as screws.

Figure 5:
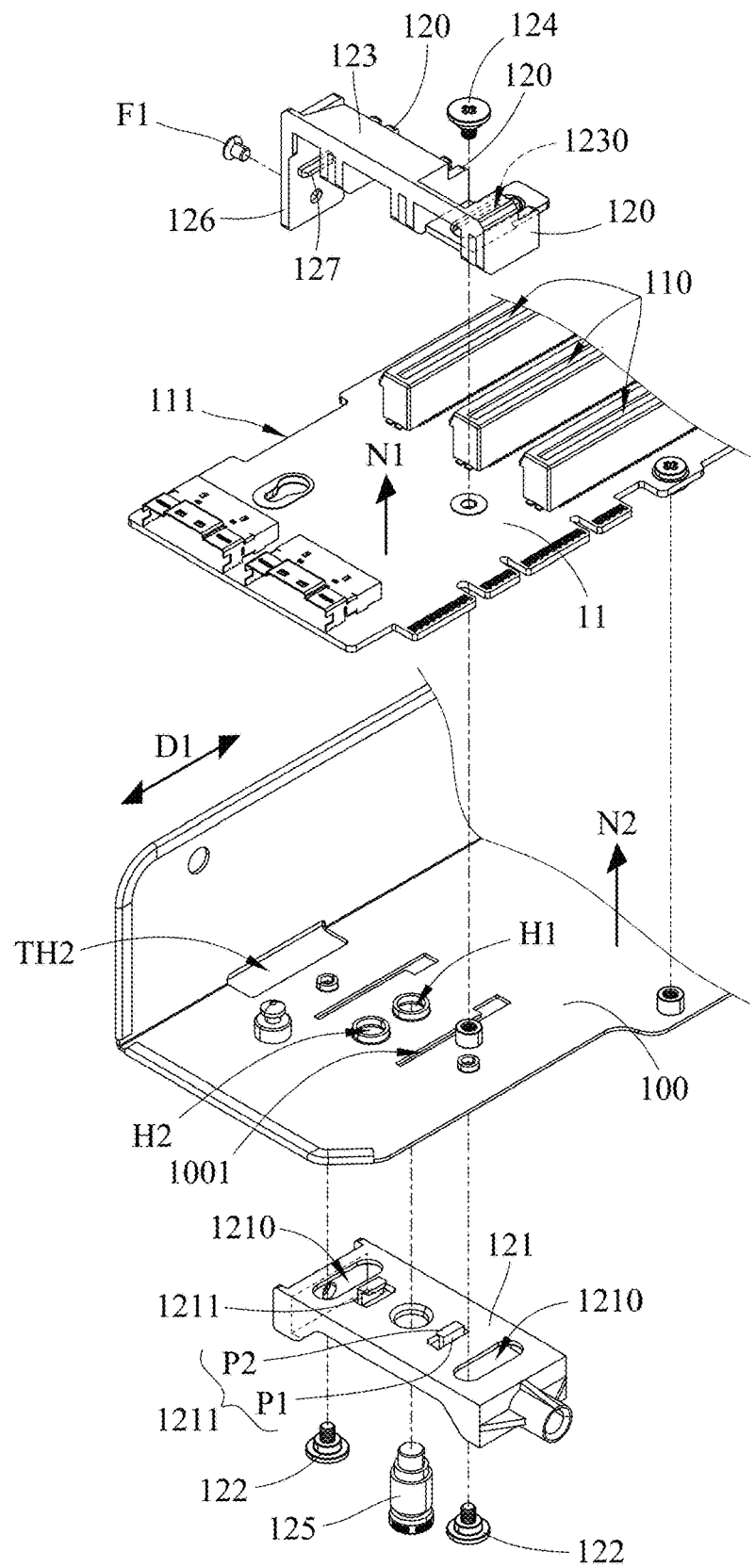
FIG. 5 is a partial and exploded view of the frame module in FIG. 4.
Figure 6:
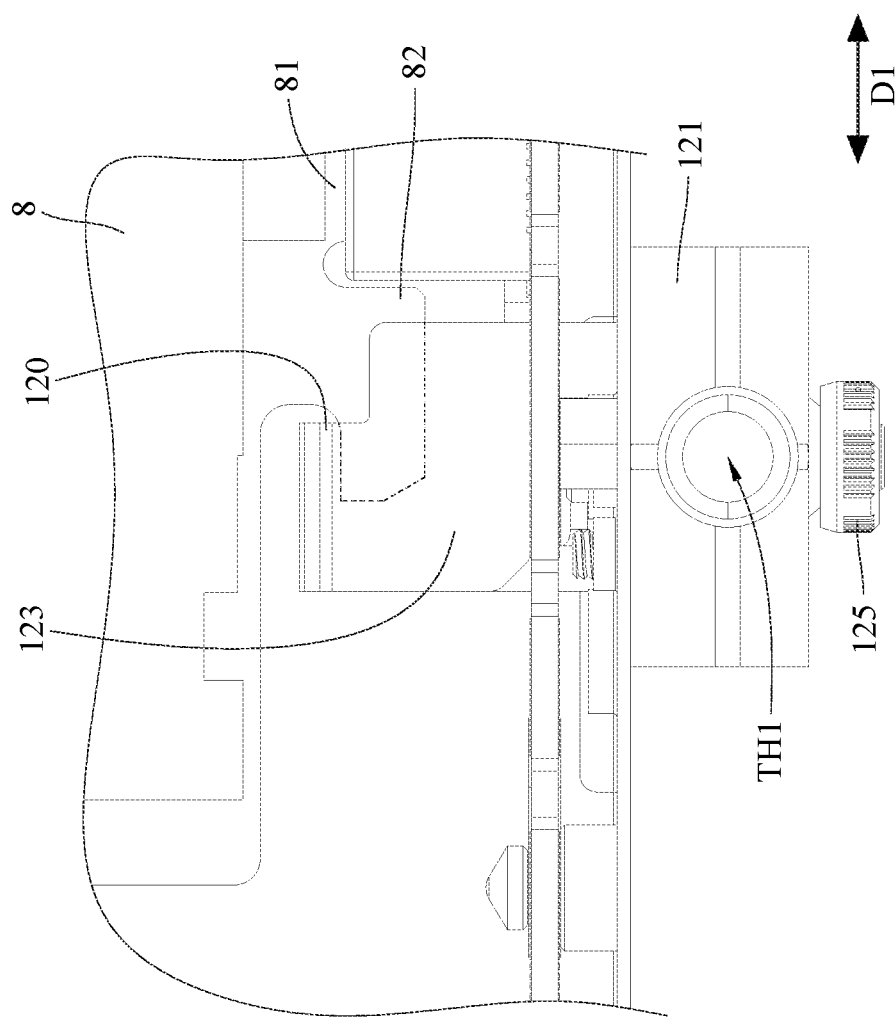
FIG. 6 is a schematic view of a fastening assembly of the frame module in FIG. 3 located in a fastening position.
Figure 7:
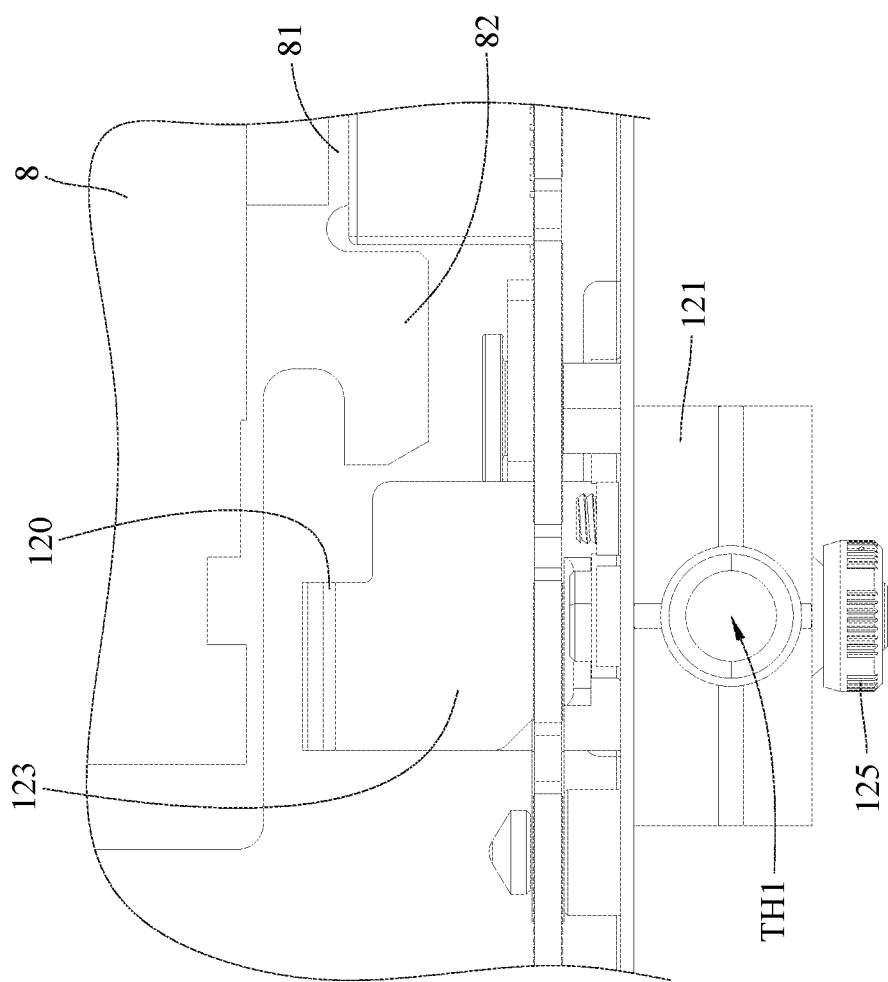
FIG. 7 is a schematic view of the fastening assembly in FIG. 3 located in a releasing position.
Figure 8:
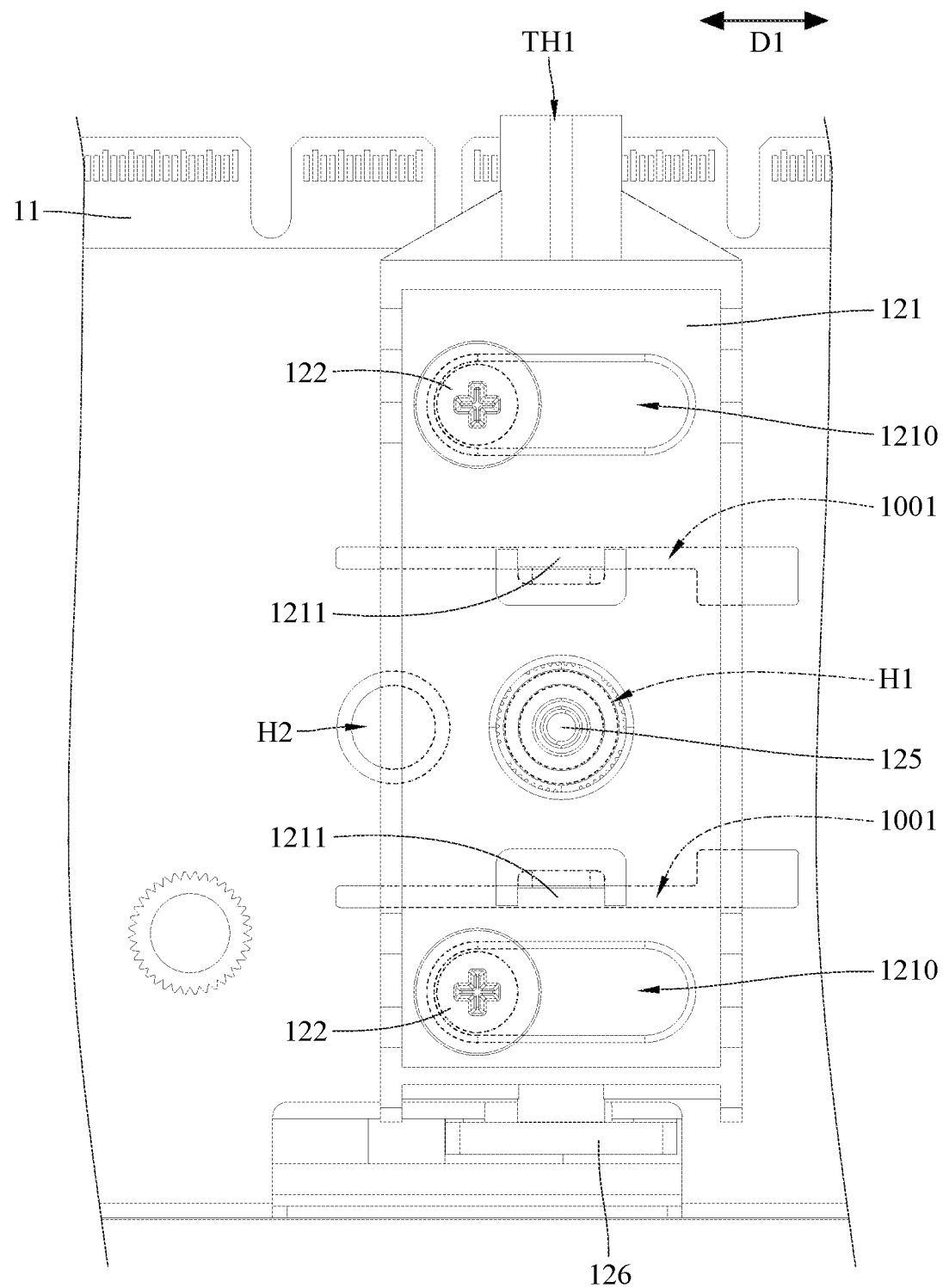
FIG. 8 is another schematic view of the fastening assembly in FIG. 6 located in the fastening position.
Figure 9:
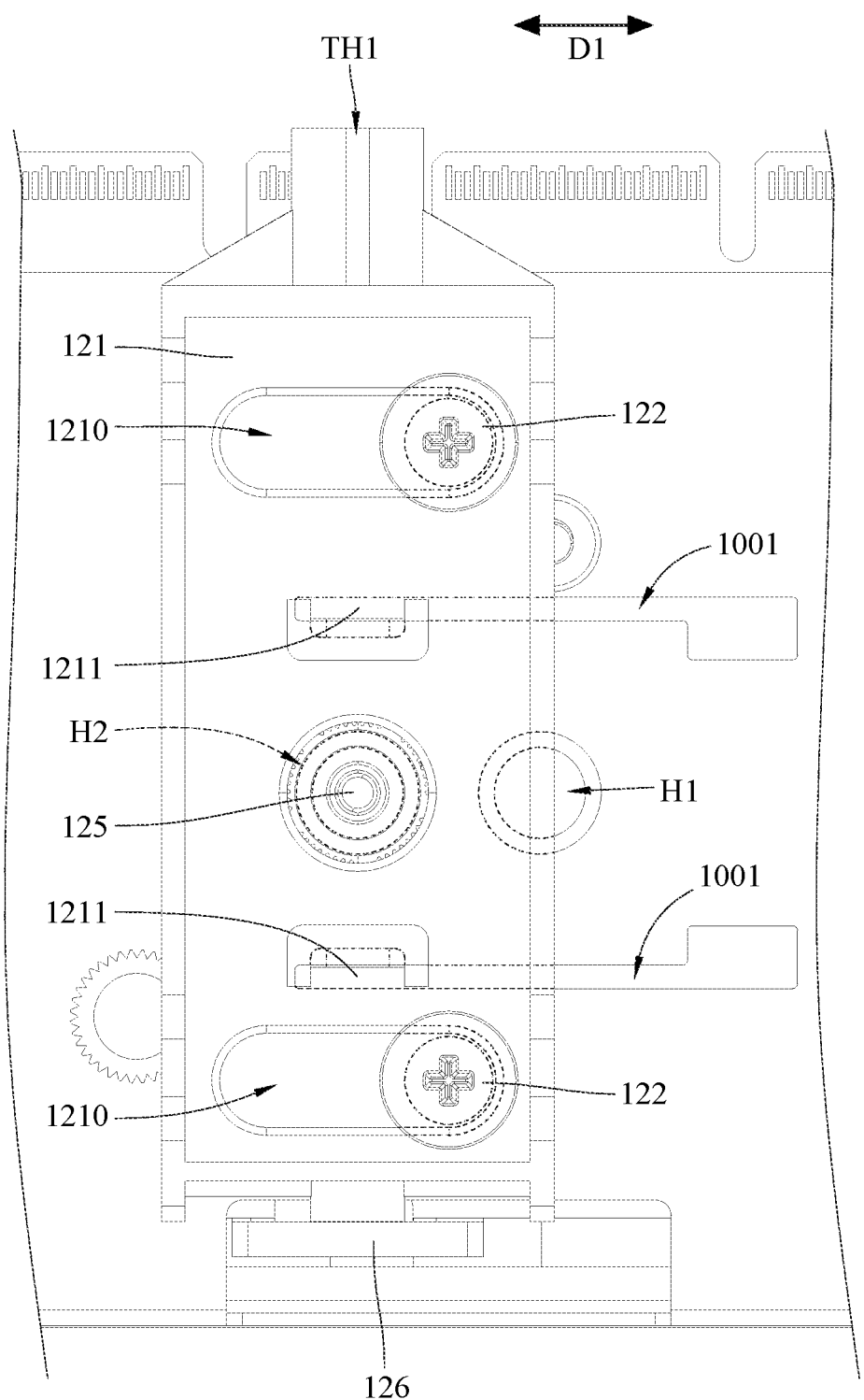
FIG. 9 is another schematic view of the fastening assembly in FIG. 7 located in the releasing position.

Please refer to FIG. 5 to FIG. 9. FIG. 5 is a partial and exploded view of the frame module in FIG. 4, FIG. 6 is a schematic view of a fastening assembly of the frame module in FIG. 3 located in a fastening position, FIG. 7 is a schematic view of the fastening assembly in FIG. 3 located in a releasing position, FIG. 8 is another schematic view of the fastening assembly in FIG. 6 located in the fastening position, and FIG. 9 is another schematic view of the fastening assembly in FIG. 7 located in the releasing position.

The fastening assembly 12 is slidably disposed on the first plate 100 of the main frame 10 in a slidable direction D1, and the fastening assembly 12 includes a fastening position and a releasing position. Said slidable direction D1 may refer to a direction where the fastening assembly 12 on the first plate 100 is moved towards or away from the second plate 101.

The fastening assembly 12 includes an operational slide block 121, an engagement slide block 123, a connection plate 126, two first guide components 122, a movable pin 125, a second guide component 124 and a restricting block 127.

The operational slide block 121 and the engagement slide block 123 are located on opposite sides of the first plate 100 of the main frame 10, and the connection plate 126 is disposed through the first plate 100 and connected to the operational slide block 121 and the engagement slide block 123, such that the engagement slide block 123 and the operational slide block 121 can move simultaneously. In addition, the engagement slide block 123 and the riser card 11 are located on the same side of the first plate 100. Specifically, the operational slide block 121 includes two first grooves 1210 extending in the slidable direction D1, and the first guide components 122 are disposed through the first grooves 1210 and fixed to the first plate 100 of the main frame 10, respectively, such that the operational slide block 121 is slidable in the slidable direction D1 between the fastening position and the releasing position relative to the first guide components 122. The first guide components 122 are, for example, stepped screws and each includes a head part, a neck part and a threaded part (not numbered). The neck part is connected to and located between the head part and the threaded part. An outer diameter of the head part is larger than an outer diameter of the neck part, and the threaded part is screwed into the first plate 100 of the main frame 10. A width of the first groove 1210 of the operational slide block 121 is larger than the outer diameter of the neck part and smaller than the outer diameter of the head part. The neck part of the first guide component 122 is disposed through the first groove 1210, and the head part of the first guide component 122 blocks the operational slide block 121 in a normal direction N2 of the first plate 100 so as to restrict the movement of the operational slide block 121 in the normal direction N2, such that the operational slide block 121 is located between the head part of the first guide component 122 and the first plate 100 of the main frame 10 and movable in the slidable direction D1.

As shown in FIG. 5, the two guiding through holes 1001 of the first plate 100 of the main frame 10 are parallel to each other and extend in the slidable direction D1. The operational slide block 121 further includes two hook structures 1211, and each of the hook structures 1211 includes an insertion part P1 and an engagement part P2 that are connected to each other. The insertion parts P1 are slidably disposed through the guiding through holes 1001, respectively, and the engagement parts P2 overlap the first plate 100 in the normal direction N2 so as to restrict the movement of the operational slide block 121 in the normal direction N2.

The movable pin 125 is movably disposed through the operational slide block 121 and movable between an insertion position and an extraction position relative to the operational slide block 121. As shown in FIG. 6 and FIG. 8, when the operational slide block 121 is located in the fastening position and the movable pin 125 is located in the insertion position, the movable pin 125 is inserted into the first positioning hole H1 of the first plate 100 of the main frame 10, so that the operational slide block 121 is positioned in the fastening position. As shown in FIG. 7 and FIG. 9, when the operational slide block 121 is located in the releasing position and the movable pin 125 is located in the insertion position, the movable pin 125 is inserted into the second positioning hole H2 of the first plate 100, so that the operational slide block 121 is positioned in the releasing position. On the other hand, when a user would like to move the fastening assembly 12 by moving the operational slide block 121, the movable pin 125 should be moved, in advance, to the extraction position so as to be removed from the first positioning hole H1 or the second positioning hole H2, so that the operational slide block 121 is movable between the fastening position and the releasing position. In this embodiment, the movable pin 125 is movable between the insertion position and the extraction position in a direction parallel to the normal direction N2, but the disclosure is not limited thereto.

The engagement slide block 123 includes a second groove 1230 and three block portions 120. The second groove 1230 extends in the slidable direction D1, and the second guide component 124 is disposed through the second groove 1230 and fixed to the first plate 100 of the main frame 10, so that the engagement slide block 123 is slidable in the slidable direction D1 between the fastening position and the releasing position relative to the second guide component 124. The second guide component 124 is, for example, a stepped screw, which includes a head part, a neck part and a threaded part (not numbered). The neck part is connected to and located between the head part and the threaded part. An outer diameter of the head part is larger than an outer diameter of the neck part, and the threaded part is screwed into the first plate 100 of the main frame 10. A width of the second groove 1230 of the engagement slide block 123 is larger than the outer diameter of the neck part and smaller than the outer diameter of the head part. The neck part of the second guide component 124 is disposed through the second groove 1230, and the head part of the second guide component 124 blocks the engagement slide block 123 in the normal direction N2 of the first plate 100 so as to restrict the movement of the engagement slide block 123 in the normal direction N2, so that the engagement slide block 123 is located between the head part of the second guide component 124 and the first plate 100 of the main frame 10 and movable in the slidable direction D1. In this embodiment, the engagement slide block 123 is slidable relative to the riser card 11 and stacked on the riser card 11, the threaded part of the second guide component 124 is disposed through the riser card 11 and screwed into the first plate 100 of the main frame 10, and the neck part of the second guide component 124 presses against the riser card 11, so that the riser card 11 is fixed to the first plate 100. In this embodiment, the engagement slide block 123 is located between the connection slots 110 of the riser card 11 and the connection cables CL; that is, the engagement slide block 123 is located on one side of the connection cables CL located closer to the second plate 101 of the main frame 10, so that the engagement slide block 123 does not interfere with the connection cables CL.

The three block portions 120 of the engagement slide block 123 are configured to press against the engagement recessed portions 82 of the three expansion cards 8, respectively. Specifically, as shown in FIG. 6, when the fastening assembly 12 is located in the fastening position, the block portions 120 of the engagement slide block 123 press against the engagement recessed portions 82 of the expansion cards 8, respectively, so that the expansion cards 8 is located between and clamped by the second plate 101 of the main frame 10 and the fastening assembly 12. As shown in FIG. 7, when the fastening assembly 12 is located in the releasing position, the block portions 120 of the engagement slide block 123 are removed from the engagement recessed portions 82 of the expansion cards 8, respectively, so that the expansion cards 8 are movable with respect to the connection slots 110 of the riser card 11.

In this embodiment, the engagement slide block 123 of the fastening assembly 12 includes more than one block portion 120, so that multiple expansion cards 8 can be secured simultaneously when the user moves the fastening assembly 12 in one time, but the disclosure is not limited to the number of block portions. In other embodiments, the quantity of the block portions may be more or less than three according to actual design requirements.

In this embodiment, the block portions 120 each includes a blocking groove (not numbered) for the engagement recessed portions 82 of the expansion cards 8 to be inserted to. When a tab structure of the engagement recessed portion 82 is inserted into the blocking groove of the block portion 120, the expansion card 8 is restricted in movement in two axial directions by the engagement slide block 123 of the fastening assembly 12.

The engagement slide block 123 is connected to the operational slide block 121 via the connection plate 126. In this embodiment, the connection plate 126 and the engagement slide block 123 are formed of a single piece, and one end portion of the connection plate 126 located farther away from the engagement slide block 123 is fixed to the operational slide block 121 by a fastener F1, but the disclosure is not limited thereto. In other embodiments, the connection plate, the engagement slide block and the operational slide block are, for example, separate components, and two end portions of the connection plate are fixed to the engagement slide block and the operational slide block, for example, by fasteners, respectively. In some other embodiments, the connection plate, the engagement slide block and the operational slide block may be formed of a single piece.

The connection plate 126 is slidably disposed through a restricting recess 111 of the riser card 11 in the slidable direction D1 and passes through a through hole TH2 of the first plate 100 of the main frame 10. The restricting block 127 is disposed on the connection plate 126, and the restricting block 127 overlaps the riser card 11 in a normal direction N1 of the riser card 11 so as to restrict the movement of the fastening assembly 12 in the normal direction N1. In this embodiment, the restricting block 127 protrudes from the connection plate 126 and is located between the riser card 11 and the first plate 100 of the main frame 10, but the disclosure is not limited thereto. In other embodiments, the restricting block may be located on one side of the riser card located farther away from the first plate. In this embodiment, the normal direction N1 is substantially parallel to the normal direction N2; that is, an angle between the normal direction N1 and the normal direction N2 is 0 degree or nearly 0 degree.

In this embodiment, the operational slide block 121 further includes a through-hole TH1 for providing foolproof function during installation of the frame module 1 onto the casing 90. Specifically, when the frame module 1 is disposed on the casing 90 of the server 9 and the fastening assembly 12 is located in the fastening position, the through-hole TH1 is configured for a guiding post 91 of the server 9 to be inserted into. When the frame module 1 is disposed on the casing 90 of the server 9 and the fastening assembly 12 is located in the releasing position, the through-hole TH1 is configured to be misaligned with the guiding post 91, and a space occupied by the operational slide block 121 is configured to overlap a space occupied by the guiding post 91. In other words, only when the fastening assembly 12 is located in the fastening position and properly secures the expansion cards 8, the through-hole TH1 of the operational slide block 121 would be aligned with the guiding post 91 of the server 9, allowing the frame module 1 to be installed in the casing 90 of the server 9. However, if the expansion cards 8 are not properly secured by the fastening assembly 12, the fastening assembly 12 would be in the releasing position or in a position different from the fastening position.

As a result, when the user installs the frame module 1, the operational slide block 121 would interfere with the guiding post 91 of the server 9, making it impossible to install the frame module 1 properly in the casing 90 of the server 9.

In this embodiment, as shown in FIG. 3, the expansion cards 8 disposed on the frame module 1 of the server 9 are half-length PCIe interface cards as an example, but the disclosure is not limited thereto. As described above, the position of the retention notch/tab structure of the PCIe-based card relative to the gold fingers is fixed in design and does not change with different PCIe-based card specifications (e.g., different dimensions). Therefore, in this disclosure, the retention notch/tab structure is used as part of a fixture means for securing PCIe-based cards having different specifications.

Figure 10:
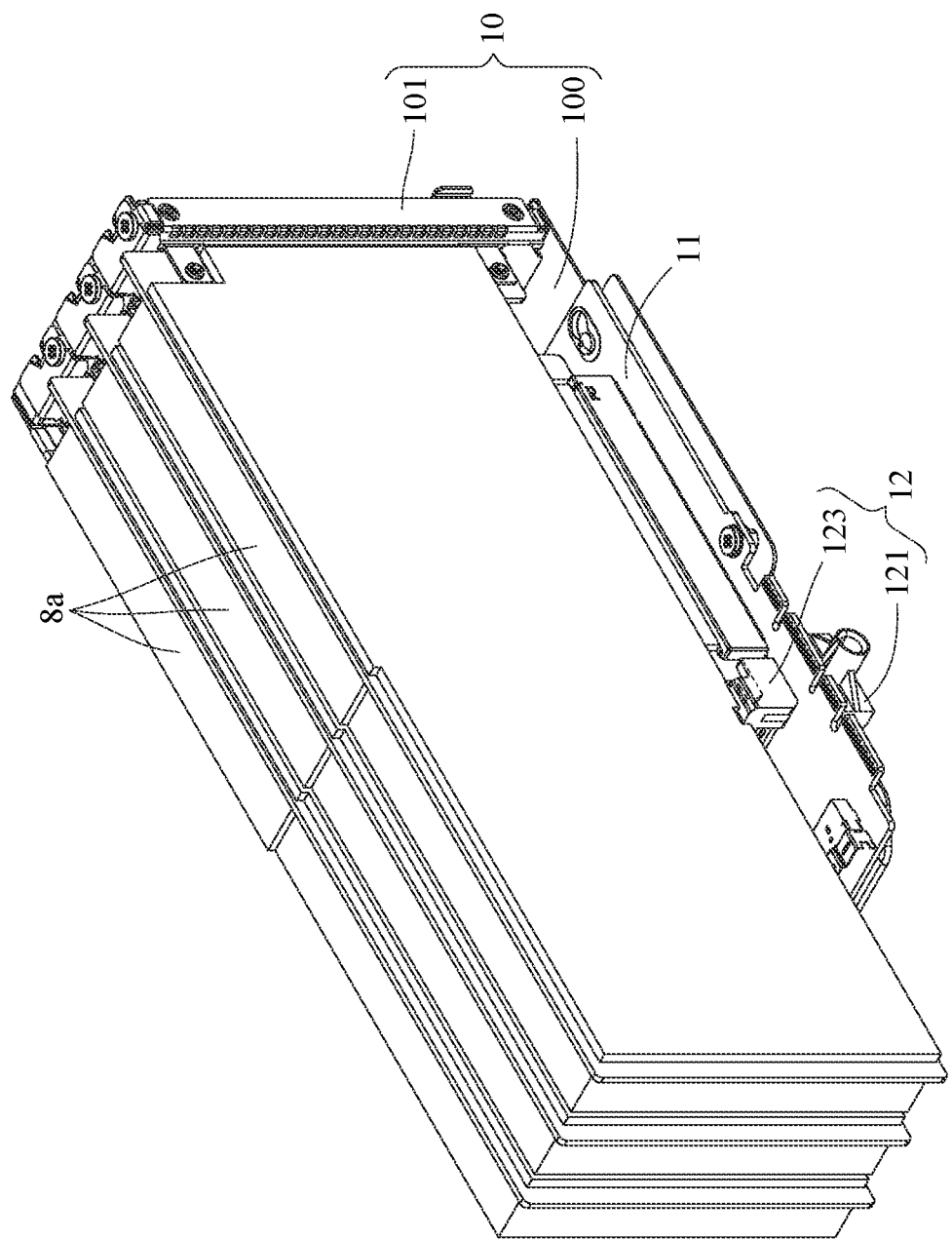
FIG. 10 is a schematic view of the frame module in FIG. 3 with expansion cards of a different length disposed thereon.

Please refer to FIG. 10, which is a schematic view of the frame module in FIG. 3 with expansion cards of a different length disposed thereon. In FIG. 10, expansion cards 8a disposed on the frame module 1 of the server 9 are full-length PCIe interface cards. As can be seen, the frame module 1 as disclosed in this embodiment is capable of securing the expansion cards 8 and/or 8a of different lengths. It is understandable that the server 9 disclosed in this embodiment can also be equipped with expansion cards of other specifications, such as ¾-length PCIe interface cards and full-height PCIe interface cards, and the disclosure is not limited thereto. Moreover, three expansion cards having different lengths from one another can also be disposed on the frame module 1 of the server 9 as disclosed in this embodiment at the same time, and the fastening assembly 12 of the frame module 1 can still secure the three expansion cards having different lengths simultaneously.

The first guide components 122, the second guide component 124, the first grooves 1210 and the second groove 1230 as disclosed in the above embodiment are optional, and the disclosure is not limited thereto. In other embodiments, the fastening assembly may be guided only through the collaboration of the hook structure of the operational slide block and the guiding through hole of the first plate when sliding.

The hook structures 1211 and the guiding through holes 1001 as disclosed in the above embodiment are optional, and the disclosure is not limited thereto. In other embodiments, the fastening assembly may be guided only through the collaboration of the guide component and the groove when sliding.

The second positioning hole H2 as disclosed in the above embodiment are optional, and the disclosure is not limited thereto. In other embodiments, the first plate may only include the first positioning hole for the movable pin to position the fastening assembly in the fastening position.

In this embodiment, the fastening assembly 12 is positioned in the fastening position or the releasing position by the movable pin 125, but the disclosure is not limited thereto. In other embodiments, the fastening assembly may be positioned in the fastening position or the releasing position by other fasteners, such as fixing plugs or screws.

The restricting block 127 and the restricting recess 111 as disclosed in the above embodiment are optional, and the disclosure is not limited thereto. In other embodiments, the fastening assembly may not include the restricting block, and the riser card may not include the restricting recess.

The through-hole TH1 of the operational slide block 121 as disclosed in the above embodiment is optional, and the disclosure is not limited thereto. In other embodiments, the operational slide block may not include the through-hole.

In view of the above description, the expansion card includes the engagement recessed portion arranged adjacent to the electrical connector portion, and the position of the engagement recessed portion relative to the electrical connector portion is fixed in design and does not change with different expansion card specifications. Accordingly, the fastening assembly slidable relative to the main frame is provided in the frame module as a fixing means for fixing the expansion card in place, and the block portion of the fastening assembly is configured to press against the engagement recessed portion of the expansion card. Therefore, the requirement of securing expansion cards of different lengths in the frame module is met.

In addition, since the fastening assembly is disposed on one side of the connection cables of the riser card located closer to the second plate, but not located in the outwardly extending direction of the connection cables, the installation of the connection cables is not interfered by the fastening assembly.

In one embodiment, the server as described in this disclosure can be used for artificial intelligence (AI) computing, edge computing, and can also be used as a 5G server, cloud server or connected car server.

The embodiments were chosen and described in order to best explain the principles of the disclosure and its practical applications, to thereby enable others skilled in the art to best utilize the disclosure and various embodiments with various modifications as are suited to the particular use contemplated. It is intended that the scope of the disclosure be defined by the following claims and their equivalents.

What is claimed is:

1. A frame module configured to be detachably disposed on a casing of a server and configured to secure at least one expansion card, one side of the at least one expansion card comprising an electrical connector portion and an engagement recessed portion that are arranged adjacent to each other, and the frame module comprising:
a main frame comprising a first plate and a second plate that are connected to each other;
a riser card disposed on the first plate, and the riser card comprising at least one connection slot configured for the electrical connector portion of the at least one expansion card to be inserted to; and
a fastening assembly slidably disposed on the first plate, the fastening assembly comprising at least one block portion, and the fastening assembly comprising a fastening position and a releasing position;
wherein when the fastening assembly is located in the fastening position, the at least one block portion is configured to press against the engagement recessed portion of the at least one expansion card, so that the at least one expansion card is located between and clamped by the second plate and the fastening assembly; when the fastening assembly is located in the releasing position, the at least one block portion is configured to be removed from the engagement recessed portion of the at least one expansion card, so that the at least one expansion card is movable with respect to the at least one connection slot;
wherein the fastening assembly comprises an operational slide block, a first guide component and an engagement slide block, the operational slide block comprises a first groove extending in a slidable direction, the first guide component is disposed through the first groove and fixed to the first plate, such that the operational slide block is slidable in the slidable direction between the fastening position and the releasing position relative to the first guide component, the engagement slide block is connected to the operational slide block, and the engagement slide block comprises the at least one block portion.

2. The frame module according to claim 1, wherein the fastening assembly further comprises a movable pin, the first plate comprises a first positioning hole and a second positioning hole, and the movable pin is movably disposed through the operational slide block and movable between an insertion position and an extraction position relative to the operational slide block;
wherein when the operational slide block is located in the fastening position and the movable pin is located in the insertion position, the movable pin is inserted into the first positioning hole of the first plate, so that the operational slide block is positioned in the fastening position;
wherein when the operational slide block is located in the releasing position and the movable pin is located in the insertion position, the movable pin is inserted into the second positioning hole of the first plate, so that the operational slide block is positioned in the releasing position;
wherein when the movable pin is located in the extraction position, the movable pin is removed from the first positioning hole or the second positioning hole of the first plate, so that the operational slide block is movable between the fastening position and the releasing position.

3. The frame module according to claim 1, wherein the operational slide block and the engagement slide block are located on opposite sides of the first plate, the engagement slide block and the riser card are located at a same side of the first plate, the fastening assembly further comprises a connection plate, and the connection plate is disposed through the first plate and connected to the operational slide block and the engagement slide block.

4. The frame module according to claim 3, wherein the fastening assembly further comprises a second guide component, the engagement slide block further comprises a second groove extending in the slidable direction, and the second guide component is disposed through the second groove and fixed to the first plate, so that the engagement slide block is slidable in the slidable direction between the fastening position and the releasing position relative to the second guide component.

5. The frame module according to claim 3, wherein the fastening assembly further comprises a restricting block disposed on the connection plate, the riser card further comprises a restricting recess, the connection plate is slidably disposed through the restricting recess and slidable in the slidable direction, and the restricting block overlaps the riser card in a normal direction of the riser card so as to restrict a movement of the fastening assembly in the normal direction of the riser card.

6. The frame module according to claim 1, wherein the operational slide block further comprises a hook structure, the first plate comprises a guiding through hole extending in the slidable direction, the hook structure comprises an insertion part and an engagement part that are connected to each other, the insertion part is slidably disposed through the guiding through hole, and the engagement part overlaps the first plate in a normal direction of the first plate so as to restrict a movement of the operational slide block in the normal direction of the first plate.

7. The frame module according to claim 1, wherein the operational slide block further comprises a through-hole;

wherein when the frame module is disposed on the casing of the server and the fastening assembly is located in the fastening position, the through-hole is configured for a guiding post of the server to be inserted into; when the frame module is disposed on the casing of the server and the fastening assembly is located in the releasing position, the through-hole is configured to be misaligned with the guiding post, and a space occupied by the operational slide block is configured to overlap a space occupied by the guiding post.

8. The frame module according to claim 1, wherein the at least one connection slot comprises a plurality of connection slots, the at least one expansion card comprises a plurality of expansion cards, the at least one block portion comprises a plurality of block portions, the plurality of connection slots are configured for the electrical connector portions of the plurality of expansion cards to be inserted to, respectively, and lengths of the plurality of expansion cards are equal or different from one another;

wherein when the fastening assembly is located in the fastening position, the plurality of block portions are configured to press against the engagement recessed portions of the plurality of expansion cards, respectively, so that the plurality of expansion cards are located between and clamped by the second plate and the fastening assembly; when the fastening assembly is located in the releasing position, the plurality of block portions are configured to be removed from the engagement recessed portions of the plurality of expansion cards, so that the plurality of expansion cards are movable with respect to the plurality of connection slots.

9. A server comprising:
a casing;
a frame module detachably disposed on the casing, and the frame module comprising:
 a main frame comprising a first plate and a second plate that are connected to each other;
 a riser card disposed on the first plate, and the riser card comprising at least one connection slot; and
 a fastening assembly slidably disposed on the first plate, the fastening assembly comprising at least one block portion, and the fastening assembly comprising a fastening position and a releasing position; and
at least one expansion card, wherein one side of the at least one expansion card comprises an electrical connector portion and an engagement recessed portion that are arranged adjacent to each other, and the electrical connector portion is inserted to the at least one connection slot;
wherein when the fastening assembly is located in the fastening position, the at least one block portion presses against the engagement recessed portion of the at least one expansion card, so that the at least one expansion card is located between and clamped by the second plate and the fastening assembly; when the fastening assembly is located in the releasing position, the at least one block portion is removed from the engagement recessed portion of the at least one expansion card, so that the at least one expansion card is movable with respect to the at least one connection slot;
wherein the fastening assembly comprises an operational slide block, a first guide component and an engagement slide block, the operational slide block comprises a first groove extending in a slidable direction, the first guide component is disposed through the first groove and fixed to the first plate, such that the operational slide block is slidable in the slidable direction between the fastening position and the releasing position relative to the first guide component, the engagement slide block is connected to the operational slide block, and the engagement slide block comprises the at least one block portion.

\* \* \* \* \*